US010979029B2

(12) United States Patent
Mukai

(10) Patent No.: US 10,979,029 B2
(45) Date of Patent: Apr. 13, 2021

(54) MULTIPLEXER

(71) Applicant: Murata Manufacturing Co., Ltd., Nagaokakyo (JP)

(72) Inventor: Takao Mukai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 33 days.

(21) Appl. No.: 16/663,440

(22) Filed: Oct. 25, 2019

(65) Prior Publication Data

US 2020/0153411 A1    May 14, 2020

(30) Foreign Application Priority Data

Oct. 8, 2018   (JP) .............................. JP2018-210507
Aug. 27, 2019 (JP) .............................. JP2019-154606

(51) Int. Cl.
    *H03H 9/64*    (2006.01)
    *H03H 9/72*    (2006.01)
    *H03H 9/25*    (2006.01)

(52) U.S. Cl.
    CPC ............ *H03H 9/6493* (2013.01); *H03H 9/25* (2013.01); *H03H 9/6483* (2013.01); *H03H 9/725* (2013.01)

(58) Field of Classification Search
    CPC ......... H03H 9/64; H03H 9/6483; H03H 9/725
    See application file for complete search history.

(56) References Cited

U.S. PATENT DOCUMENTS

| 6,924,715 | B2 * | 8/2005 | Beaudin | H03H 9/14547 |
| | | | | 330/306 |
| 8,476,991 | B2 * | 7/2013 | Goto | H03H 9/02944 |
| | | | | 333/193 |
| 9,112,478 | B2 * | 8/2015 | Moriya | H03H 9/725 |
| 9,184,782 | B2 * | 11/2015 | Taniguchi | H03H 9/74 |
| 2018/0109243 | A1 | 4/2018 | Takamine | |
| 2019/0149312 | A1 | 5/2019 | Takamine | |

FOREIGN PATENT DOCUMENTS

| KR | 10-2018-0003626 A | 1/2018 |
| WO | 2018/003297 A1 | 1/2018 |

* cited by examiner

*Primary Examiner* — Dean O Takaoka
(74) *Attorney, Agent, or Firm* — Keating & Bennett, LLP

(57) ABSTRACT

A multiplexer includes a filter arranged in a first path, a filter arranged in a second path, and a filter arranged in a third path, in which a frequency of intermodulation distortion (IMD) generated from a transmission signal in a pass band of the filter and a transmission signal in a pass band of the filter is included in a pass band of the filter. The filters includes one or more series arm resonant circuits arranged on the first path and one or more parallel arm resonant circuits arranged in a path connecting corresponding nodes on the first path and the ground, in which at least one resonant circuit among the resonant circuits closest to a common terminal in one or more series arm resonant circuits and one or more parallel arm resonant circuits is defined by a divided resonator group defined by multiple divided resonators connected in series.

11 Claims, 4 Drawing Sheets

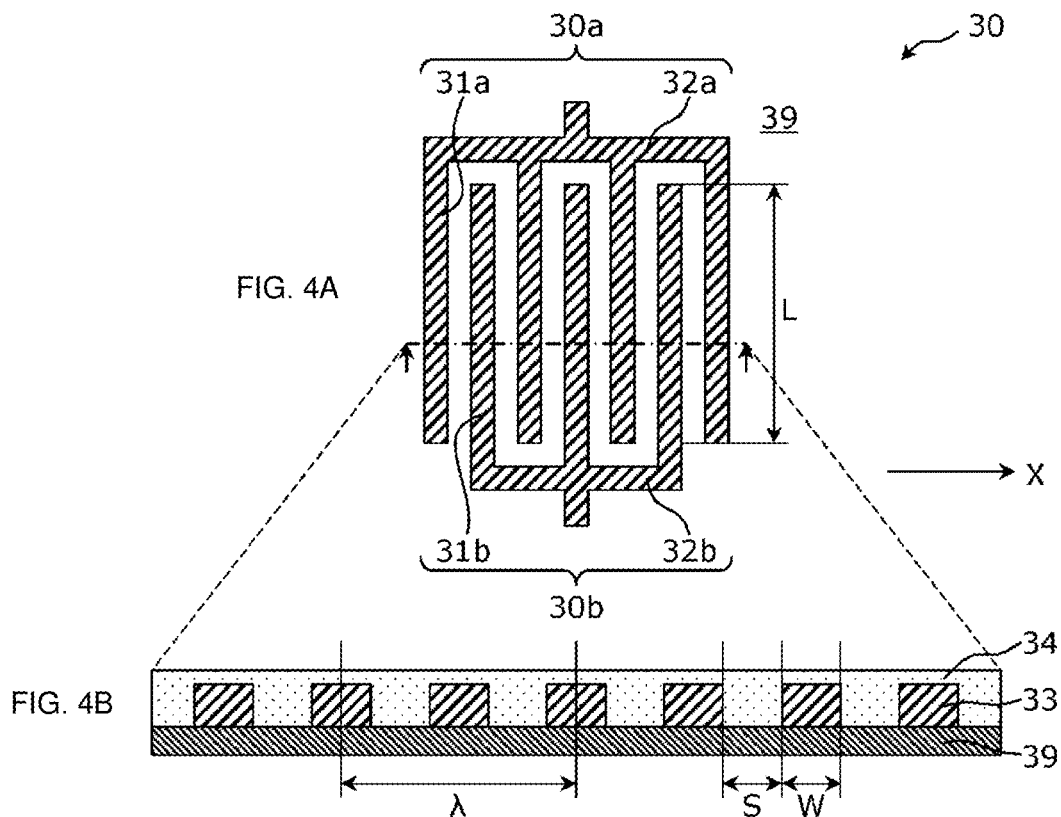
FIG. 4A
FIG. 4B
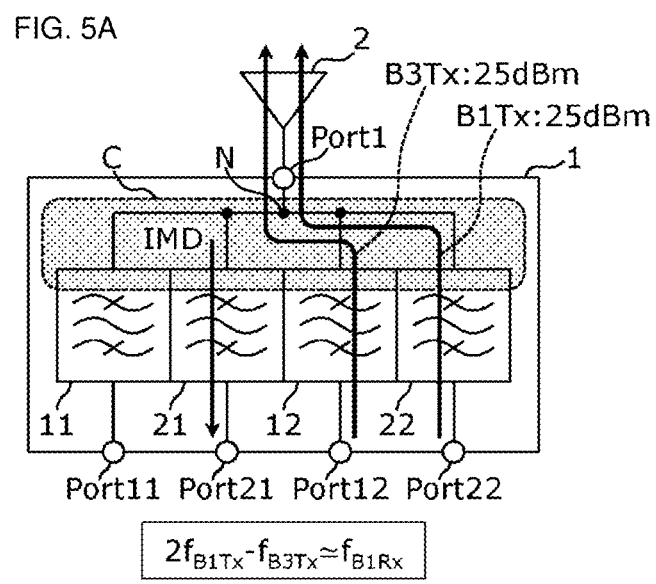
FIG. 5A
$$2f_{B1Tx} - f_{B3Tx} \simeq f_{B1Rx}$$

MULTIPLEXER

CROSS REFERENCE TO RELATED APPLICATIONS

This application claims the benefit of priority to Japanese Patent Application No. 2018-210507 filed on Nov. 8, 2018 and Japanese Patent Application No. 2019-154606 filed on Aug. 27, 2019. The entire contents of these applications are hereby incorporated herein by reference.

BACKGROUND OF THE INVENTION

1. Field of the Invention

The present invention relates to a multiplexer.

2. Description of the Related Art

In recent years, in order to perform communication corresponding to a plurality of frequency bands (multiband) and a plurality of radio systems (multi-mode) by one terminal, there has been proposed, for example, a quadplexer in which two duplexers including a transmission filter and a reception filter each including an acoustic wave resonator are connected to a common terminal (for example, International Publication No. WO 2018/003297).

However, in a multiplexer such as a quadplexer defined by using an acoustic wave filter as in International Publication No. WO 2018/003297, intermodulation distortion (IMD) is likely to occur due to nonlinearity of the acoustic wave filter itself.

In particular, in a multiplexer applied to a carrier aggregation (CA) which performs communication by using a plurality of frequency bands at the same time, IMD having a frequency equal to that of a reception signal may be generated from transmission signals of two different frequency bands. Such IMD is generated by interference between transmission signals, so that signal strength is large, and bandpass characteristics of the multiplexer are likely to deteriorate.

SUMMARY OF THE INVENTION

Preferred embodiments of the present invention provide multiplexers each including a plurality of acoustic wave filters, which are capable of reducing the occurrence of IMD in a multiplexer, and having excellent bandpass characteristics.

A multiplexer according to a preferred embodiment of the present invention includes a first transmission filter provided in a first path electrically connecting a common terminal and a first terminal, a second transmission filter provided in a second path electrically connecting the common terminal and a second terminal, and a reception filter provided in a third path electrically connecting the common terminal and a third terminal, in which a frequency of intermodulation distortion generated from a first transmission signal of a frequency included in a pass band of the first transmission filter and a second transmission signal of a frequency included in a pass band of the second transmission filter is included in a pass band of the reception filter, the first transmission filter includes one or more series arm resonant circuits provided in the first path and one or more parallel arm resonant circuits provided in a path electrically connecting a corresponding node on the first path and the ground, and in the one or more series arm resonant circuits and the one or more parallel arm resonant circuits of the first transmission filter, at least one resonant circuit among resonant circuits closest to the common terminal is defined by a group of divided resonators including a plurality of divided resonators electrically connected in series to each other.

A multiplexer according to a preferred embodiment of the present invention includes a first transmission filter provided in a first path electrically connecting a common terminal and a first terminal, a second transmission filter provided in a second path electrically connecting the common terminal and a second terminal, and a reception filter provided in a third path electrically connecting the common terminal and a third terminal, in which a frequency of intermodulation distortion generated from a first transmission signal of a frequency included in a pass band of the first transmission filter and a second transmission signal of a frequency included in a pass band of the second transmission filter is included in a pass band of the reception filter, the first transmission filter includes one or more series arm resonant circuits arranged in the first path and one or more parallel arm resonant circuits arranged in a path electrically connecting a corresponding node on the first path and the ground, the one or more series arm resonant circuits and the one or more parallel arm resonant circuits of the first transmission filter are each defined by an acoustic wave resonator including an interdigital transducer (IDT) electrode, and a duty ratio of an IDT electrode of at least one resonant circuit among resonant circuits closest to the common terminal in the one or more series arm resonant circuits and the one or more parallel arm resonant circuits of the first transmission filter is smaller than a duty ratio of an IDT electrode of any other resonant circuits of the first transmission filter.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A and 4B are schematic diagrams illustrating examples of a basic structure of an acoustic wave resonator according to a preferred embodiment of the present invention.

FIG. 5A is a schematic diagram illustrating an example of IMD generated in a multiplexer according to a preferred embodiment of the present invention.

DETAILED DESCRIPTION OF THE PREFERRED EMBODIMENTS

Hereinafter, preferred embodiments of the present invention will be described in detail with reference to the drawings. The preferred embodiments described below show inclusive or specific examples. The numerical values, shapes, materials, elements, arrangement and electrical connection configurations of the elements shown in the following preferred embodiments are merely examples, and are not intended to limit the scope of the present invention. In the following preferred embodiments, the term "connected" includes not only a case where there is direct electrical connection by a wiring conductor but also a case where an electrical connection is made with another circuit element interposed therebetween.

A multiplexer according to a preferred embodiment of the present invention will be described with reference to an example of a quadplexer.

Figure 1:
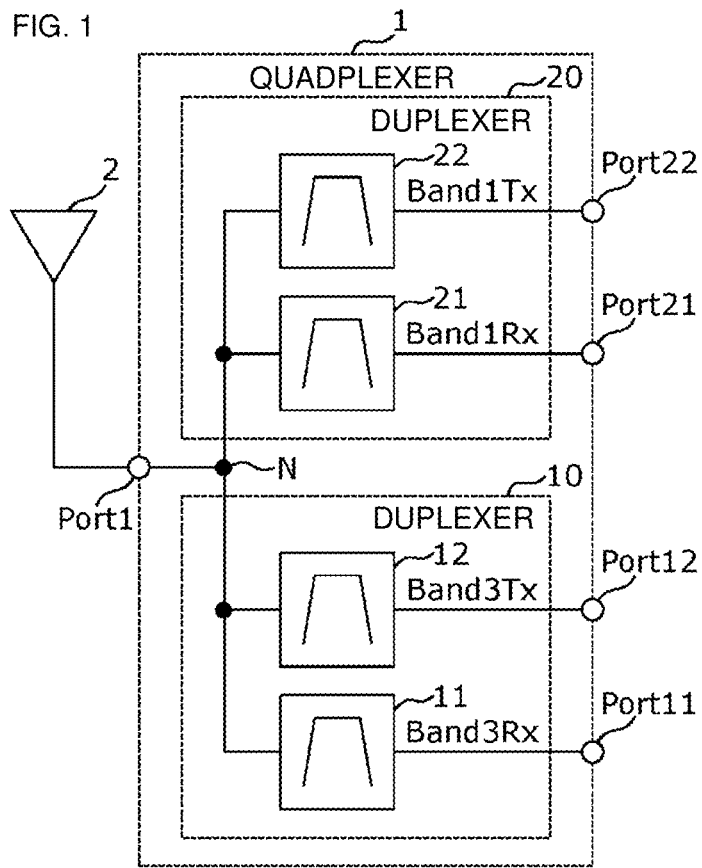
FIG. 1 is a block diagram illustrating an example of a functional configuration of a basic multiplexer according to a preferred embodiment of the present invention.

FIG. 1 is a block diagram illustrating an example of a functional configuration of a basic quadplexer according to a preferred embodiment. FIG. 1 also illustrates an antenna element 2 connected to a common terminal Port1 of a quadplexer 1.

The quadplexer 1, for example, corresponds to the Long Term Evolution (LTE) (registered trademark) standard and passes a high frequency signal of Band, which will be described later, defined in the Third Generation Partnership Project (3GPP) (registered trademark).

As illustrated in FIG. 1, the quadplexer 1 preferably includes the common terminal Port1, four individual terminals Port11, Port12, Port21, and Port22, and four filters 11, 12, 21, and 22.

The common terminal Port1 is provided in common to the four filters 11, 12, 21 and 22, and is connected to the filters 11, 12, 21 and 22 inside the quadplexer 1. Further, the common terminal Port1 is connected to the antenna element 2 outside the quadplexer 1. That is, the common terminal Port1 is also an antenna terminal of the quadplexer 1.

The individual terminals Port11, Port12, Port21, and Port22 are provided corresponding to the filters 11, 12, 21, and 22, respectively, and are connected to the corresponding filters inside the quadplexer 1. Further, the individual terminals Port11, Port12, Port21, and Port22 are connected to an RF signal processing circuit (for example, RFIC: Radio Frequency Integrated Circuit) (not illustrated) with an amplifier circuit or the like (not illustrated) interposed therebetween outside the quadplexer 1.

The filter 11 is preferably a reception filter provided in a path connecting the common terminal Port1 and the individual terminal Port11, and having a pass band for a downlink frequency band in a Band3.

The filter 12 is preferably a transmission filter provided in a path connecting the common terminal Port1 and the individual terminal Port12, and having a pass band for an uplink frequency band in the Band3.

The filter 21 is a preferably reception filter provided in a path connecting the common terminal Port1 and the individual terminal Port21, and having a pass band for a downlink frequency band in a Band1.

The filter 22 is preferably a transmission filter provided in a path connecting the common terminal Port1 and the individual terminal Port22, and having a pass band of an uplink frequency band in the Band1.

Here, the individual terminal Port22 is an example of a first terminal, and the filter 22 is an example of a first transmission filter provided in a first path connecting the common terminal Port1 and the individual terminal Port22 defining and functioning as the first terminal.

Further, the individual terminal Port12 is an example of a second terminal, and the filter 12 is an example of a second transmission filter provided in a second path connecting the common terminal Port1 and the individual terminal Port12 as the second terminal.

Further, the individual terminal Port21 is an example of a third terminal, and the filter 21 is an example of a second transmission filter provided in a third path connecting the common terminal Port1 and the individual terminal Port21 as the third terminal.

The filter 11 and the filter 12 define a duplexer 10 that demultiplexes and multiplexes the transmission signal and the reception signal of the Band3. The filter 21 and the filter 22 define a duplexer 20 that demultiplexes and multiplexes the transmission signal and the reception signal of the Band1.

In this manner, the quadplexer 1 is configured such that the common terminal of the duplexer 10 of the Band3 and the common terminal of the duplexer 20 of the Band1 are connected to each other at a node N, and are further connected to the common terminal Port1.

In the quadplexer 1, impedance elements, such as impedance matching inductors, for example, may be connected in a path connecting the filters 11, 12, 21, and 21, and the node N, a path connecting the node N and the common terminal Port1, or the like.

A specific range of frequency bands allocated to the Band1 and the Band3, which are the pass bands of the quadplexer 1, will now be described. In the following description, a numerical range indicating equal to or more than A and equal to or less than B is simplified as A to B for the frequency band range.

Figure 2:
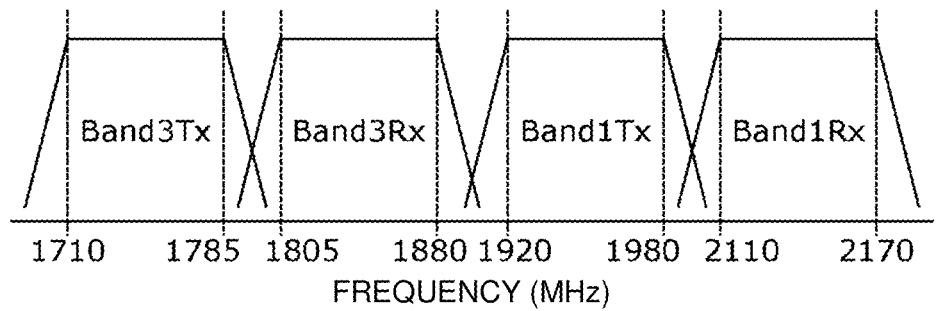
FIG. 2 is a diagram illustrating an example of a pass band of a filter configuring a multiplexer according to a preferred embodiment of the present invention.

FIG. 2 is a diagram that explains frequency bands allocated to the Band1 and the Band3. Hereinafter, the downlink frequency band (reception band) and the uplink frequency band (transmission band) of each Band may be described as, for example, "Band1Rx" for the reception band of the Band1, by being simplified with a band name and a character Rx or Tx indicating the reception band or the transmission band added to the end thereof.

As illustrated in FIG. 2, in the Band1, for example, about 1920 MHz to about 1980 MHz is allocated to a transmission band Band1Tx, and about 2110 MHz to about 2170 MHz is allocated to a reception band Band1Rx. In the Band3, about 1710 MHz to about 1785 MHz is allocated to a transmission band Band3Tx, and about 1805 MHz to about 1880 MHz is allocated to a reception band Band3Rx. Therefore, the filters 11, 12, 21, and 22 are required to have characteristics such that they pass the transmission band or the reception band of the corresponding Band and attenuate other bands, as indicated by solid lines in FIG. 2.

Next, the basic configuration of each of the filters 11, 12, 21, and 22 will be described by taking, as an example, the filter 22 (first transmission filter) having the Band1Tx as a pass band. It should be noted that the filter configuration described below may be applied to the filters 11, 12, and 21 as well as the filter 22.

Figure 3:
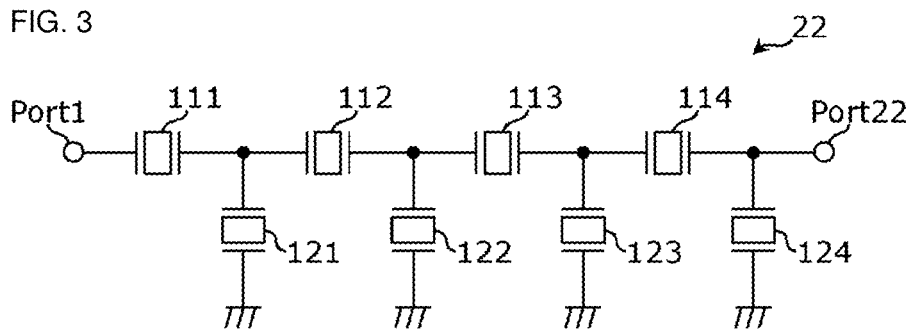
FIG. 3 is a circuit diagram illustrating an example of a basic configuration of a filter according to a preferred embodiment of the present invention.

FIG. 3 is a circuit diagram illustrating an example of the basic configuration of the filter 22. As illustrated in FIG. 3, the filter 22 preferably includes series arm resonant circuits 111 to 114 and parallel arm resonant circuits 121 to 124. Each of the series arm resonant circuits 111 to 114 and the parallel arm resonant circuits 121 to 124 is preferably defined by, for example, a surface acoustic wave (SAW) resonator, i.e., an acoustic wave resonator including an IDT electrode.

The series arm resonant circuits 111 to 114 are connected in series from the common terminal Port1 side in this order in a path (series arm) connecting the common terminal Port1 and the individual terminal Port22. Further, the parallel arm resonant circuits 121 to 124 are connected in parallel in a path (parallel arm) connecting a corresponding connection point of each of the series arm resonant circuits 111 to 114 and a reference terminal (ground). Thus, the filter 22 defines a band-pass filter having a four-stage ladder structure.

The number of series arm resonant circuits and parallel arm resonant circuits included in the filter 22 is not limited to four, and it is sufficient that one or more series arm resonant circuits and one or more parallel arm resonant circuits are provided. That is, the filter 22 may be a filter having the ladder structure of one or more stages.

Also, the parallel arm resonant circuits 121 to 124 may be connected to the reference terminal (ground terminal) with an inductor interposed therebetween (not illustrated). Impedance elements, such as inductors and capacitors, for example, may be inserted or connected on either or both of the series arm and/or the parallel arm.

Further, a parallel arm resonant circuit may be connected to a node on the common terminal Port1 side of the series arm resonant circuit 111 which is closest to the common terminal Port1 among the series arm resonant circuits 111 to 114 which define a ladder filter structure. Further, the parallel arm resonant circuit 124 connected to a node on the individual terminal Port22 side of the series arm resonant circuit 114 closest to the individual terminal Port22 may be omitted.

Next, a basic structure of the acoustic wave resonator used in the resonant circuit defining the filter 22 will be described.

FIGS. 4A and 4B are schematic diagrams illustrating examples of the basic structure of an acoustic wave resonator according to a preferred embodiment of the present invention, in which FIG. 4A is a plan view and FIG. 4B is a side view. FIG. 4B corresponds to a cross section taken along a dashed-dotted line illustrated in FIG. 4A. The structure of an acoustic wave resonator 30 illustrated in FIGS. 4A and 4B is also applied to the acoustic wave resonator included in any resonant circuit of, for example, the series arm resonant circuits 111 to 114 and the parallel arm resonant circuits 121 to 124 defining the filter 22, and the resonant circuit defining the filters 11, 12, and 21. Note that the example illustrated in FIGS. 4A and 4B explains the basic structure of the acoustic wave resonator, and the number and length of electrode fingers defining the electrode are not limited thereto.

The acoustic wave resonator 30 is defined by providing an IDT electrode 33 on a piezoelectric layer 39 with a protective layer 34 covering the IDT electrode 33. As an example, the piezoelectric layer 39 may preferably be made of, for example, a piezoelectric material containing lithium tantalate, lithium niobate, or the like, and the IDT electrode 33 may preferably be made of, for example, a metal such as copper, aluminum, or the like, or an alloy thereof. The protective layer 34 may preferably be made of, for example, a protective material including silicon dioxide or the like as a main component. The piezoelectric layer 39 may be provided on a support substrate made of a silicon substrate or the like, or the piezoelectric layer 39 itself may be a support substrate.

The IDT electrode 33 includes a pair of comb-shaped electrodes 30a and 30b opposed to each other. The comb-shaped electrode 30a includes a plurality of electrode fingers 31a parallel or substantially parallel to each other and a bus bar electrode 32a connecting the plurality of electrode fingers 31a. The comb-shaped electrode 30b includes a plurality of electrode fingers 31b parallel or substantially parallel to each other and a bus bar electrode 32b connecting the plurality of electrode fingers 31b. The electrode fingers 31a and 31b are provided along a direction orthogonal or substantially orthogonal to an X-axis direction. An acoustic wave excited by the IDT electrode 33 propagates in the X-axis direction in the piezoelectric layer 39.

A parameter defining the shape and size of the IDT electrode 33 is referred to as an electrode parameter. Examples of the electrode parameters include a wavelength λ which is a repeating period in the propagation direction of the acoustic wave of the electrode finger 31a or the electrode finger 31b, an intersecting width L which is a length in which the electrode fingers 31a and 31b overlap with each other when viewed in the propagation direction of the acoustic wave, a line width W of the electrode fingers 31a and 31b, and a space width S between the adjacent electrode fingers 31a and 31b.

The number of pairs N of the electrode fingers, which is half the number of the sum of the electrode fingers 31a and 31b, an electrode pitch (W+S) which is a repeating period of the electrode fingers 31a and 31b, and a duty ratio W/(W+S) which is a ratio of the line width W to the electrode pitch are also examples of the electrode parameters.

Next, IMD generated in the multiplexer will be described with reference to an example of the configuration of the quadplexer 1 illustrated in FIG. 1 and the frequency band illustrated in FIG. 2.

FIG. 5A illustrates an example of IMD generated in the quadplexer 1 when simultaneously transmitting a transmission signal B1Tx of the Band1 and a transmission signal B3Tx of the Band3 from one antenna element 2 with the quadplexer 1 interposed therebetween.

Figure 5B:
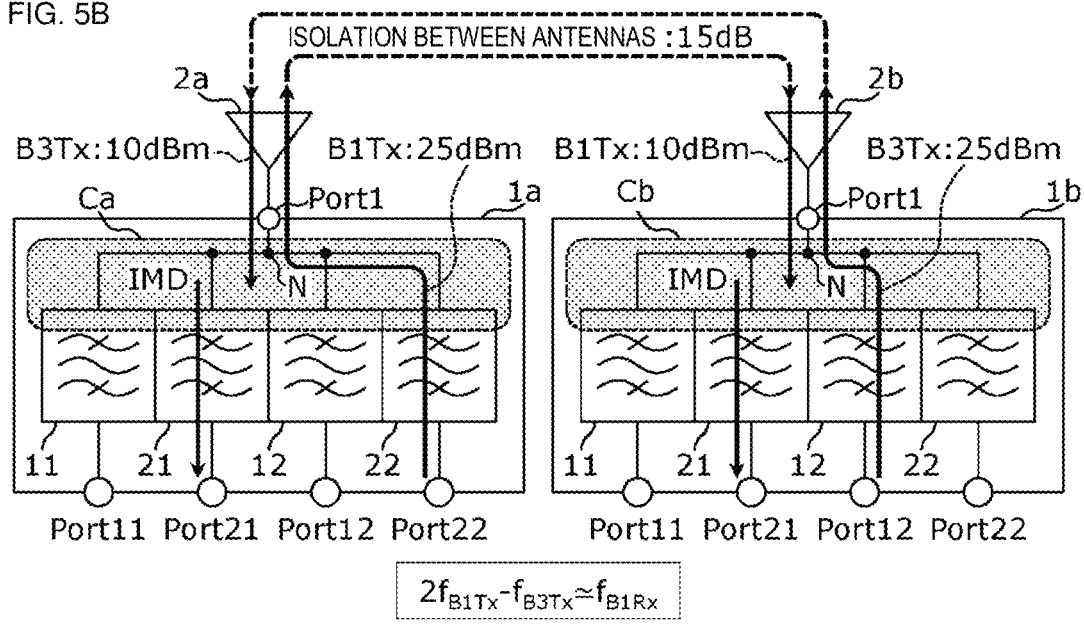
FIG. 5B is a schematic diagram illustrating an example of IMD generated in a multiplexer according to a preferred embodiment of the present invention.

FIG. 5B illustrates an example of IMD generated in quadplexers 1a and 1b when simultaneously transmitting the transmission signal of the Band1 and the transmission signal of the Band3 from two antenna elements 2a and 2b with the quadplexers 1a and 1b interposed therebetween, respectively. Each of the quadplexers 1a and 1b has the same or substantially the same configuration as that of the quadplexer 1.

In both of FIGS. 5A and 5B, the transmission signals B1Tx and B3Tx having such a strength to be actually transmitted are concentrated in circuit portions C, Ca, and Cb (illustrated by shading) of the quadplexers 1, 1a, and 1b directly or through coupling between the antenna elements 2a and 2b. Therefore, IMD of the transmission signals B1Tx and B3Tx is likely to be generated in the circuit portions C, Ca, and Cb.

For example, a frequency $2f_{B1Tx}-f_{B3Tx}$ obtained by subtracting a frequency $f_{B3Tx}$ of the transmission signal B3Tx from two times a frequency $f_{B1Tx}$ of the transmission signal B1Tx is overlapped with a frequency $f_{B1Rx}$ of a reception signal B1Rx of the Band1. When the IMD included in the Band1Rx is generated from the transmission signals B1Tx and B3Tx, the reception signal B1Rx is blocked by the generated IMD, so that the reception sensitivity in the Band1 is deteriorated.

A non-linear element often generates IMD in the circuit portions C, Ca, and Cb is, for example, an acoustic wave resonator included in the resonant circuit closest to the common terminal Port1 among the resonant circuits which define the filter 22. In the example of FIG. 3, in the series arm resonant circuits 111 to 114 and the parallel arm resonant circuits 121 to 124 which define the filter 22, the series arm resonant circuit 111 and the parallel arm resonant circuit 121 are directly connected to the common terminal Port1, so that they are the resonant circuits closest to the common terminal Port1.

In the resonant circuit closest to the common terminal Port1, power of a plurality of signals (for example, power of the transmission signals B1Tx and B3Tx) tends to concentrate. Therefore, such a large electric power that a non-linear response is generated concentrates in the acoustic wave resonator included in the resonant circuit, thereby causing the IMD to occur.

Therefore, in the present preferred embodiment, the acoustic wave resonator included in the resonant circuit closest to the common terminal Port1 in the filter 22 is configured to have a structure in which power consumption per unit area (hereinafter simply referred to as power consumption) occupied in the piezoelectric substrate is not likely to be larger than that in the acoustic wave resonator included in the other resonant circuits. Note that when there are a plurality of resonant circuits closest to the common terminal Port1 (for example, the series arm resonant circuit 111 and the parallel arm resonant circuit 121 in FIG. 3), a structure in which power consumption is not likely to be large is applied to the acoustic wave resonator included in at least one (or may be all) of the resonant circuits closest to the common terminal Port1.

Figure 6:
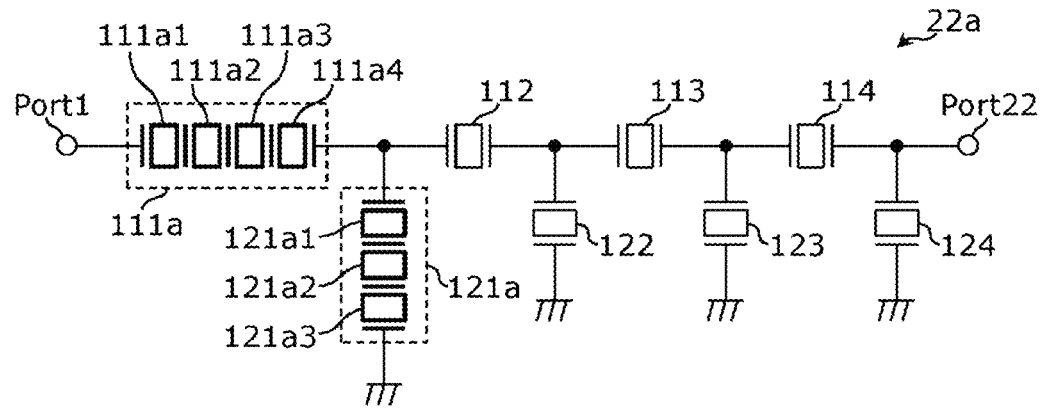
FIG. 6 is a circuit diagram illustrating an example of a configuration of a filter according to a preferred embodiment of the present invention.

FIG. 6 is a circuit diagram illustrating an example of a configuration of a filter according to a preferred embodiment of the present invention. As illustrated in FIG. 6, a filter 22a is different from the filter 22 in FIG. 3 in that each of a series arm resonant circuit 111a and a parallel arm resonant circuit 121a (illustrated by a thick line) is defined by a group of divided resonators.

The group of divided resonators is a resonant circuit including a plurality of acoustic wave resonators connected in series to each other, and is defined to have a configuration in which a circuit element other than the plurality of acoustic wave resonators and the ground is not connected to a connection node connecting the plurality of acoustic wave resonators.

The series arm resonant circuit 111a is defined by a group of divided resonators including a plurality of divided resonators 111a1, 111a2, 111a3, and 111a4 connected in series to each other. The parallel arm resonant circuit 121a is defined by a group of divided resonators including a plurality of divided resonators 121a1, 121a2, and 121a3 connected in series to each other. Each of the divided resonators 111a1 to 111a4 and 121a1 to 121a3 is also an acoustic wave resonator including IDT electrodes, and preferably has the structure illustrated in FIGS. 4A and 4B, for example.

In general, in a group of divided resonators including a plurality of divided resonators connected in series to each other, in order to obtain the same capacitance as that of a single acoustic wave resonator, an acoustic wave resonator having capacitance larger than that of the single acoustic wave resonator is used for the individual divided resonators. Therefore, in the resonant circuit defined by the group of divided resonators, since an area occupied by the resonant circuit in the piezoelectric substrate is larger than that of the resonant circuit having the same capacitance and defined by the single acoustic wave resonator, the power consumption per unit area is reduced, so that the IMD generated in the resonant circuit is reduced.

In the example of the filter 22a, since the series arm resonant circuit 111a and the parallel arm resonant circuit 121a defined by the group of divided resonators are larger in area occupied in the piezoelectric substrate than the series arm resonant circuit 111 and the parallel arm resonant circuit 121 defined by the single acoustic wave resonator, the power consumption per unit area is reduced, so that the IMD is reduced. Further, since the series arm resonant circuit 111a and the parallel arm resonant circuit 121a which are closest to the common terminal Port1 and in which the power of the signal is most likely to concentrate are defined by the group of divided resonators, the effect of reducing the IMD can be maximized with respect to the demerit that the resonant circuit becomes larger in size.

Figure 7:
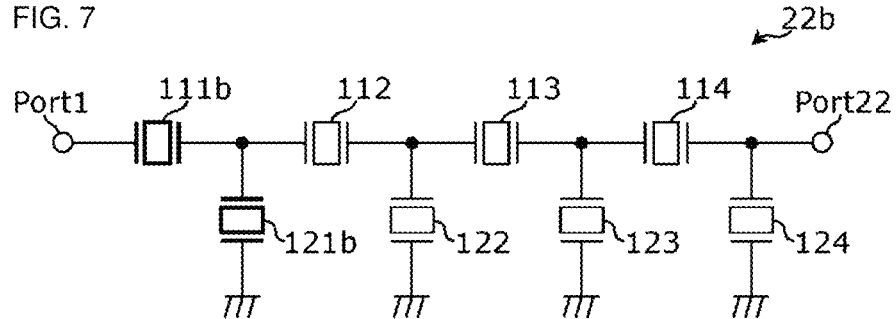
FIG. 7 is a circuit diagram illustrating another example of a configuration of the filter according to a preferred embodiment of the present invention.

FIG. 7 is a circuit diagram illustrating another example of the configuration of a filter according to a preferred embodiment of the present invention. As illustrated in FIG. 7, the filter 22b is different from the filter 22 illustrated in FIG. 3 in that a duty ratio of the IDT electrodes of the series arm resonant circuit 111b and the parallel arm resonant circuit 121b (illustrated by thick lines) is each configured to be smaller than a duty ratio of the IDT electrodes of the series arm resonant circuit 111 and the parallel arm resonant circuit 121.

In general, when the duty ratio of the IDT electrode is reduced, a resonance characteristic of the acoustic wave resonator is shifted to a high frequency side. Such a variation in the resonance characteristic can be canceled by increasing the repeating period of the electrode fingers, for example, when the number of pairs and the intersecting width of the IDT electrode are made constant. For this reason, since in an acoustic wave resonator in which the duty ratio of the IDT electrode is reduced and the repeating period of the electrode fingers is widened in order to cancel the variation of the resonance characteristic, the area occupied by the acoustic wave resonator in the piezoelectric substrate is increased, the power consumption per unit area is reduced, so that the IMD generated in the acoustic wave resonator is reduced.

In the example of the filter 22b, the duty ratio of the IDT electrodes of the series arm resonant circuit 111b and the parallel arm resonant circuit 121b is configured to be smaller than the duty ratio of the IDT electrodes of the other resonance circuits. According to the series arm resonant circuit 111b and the parallel arm resonant circuit 121b, since the area occupied in the piezoelectric substrate is increased and the power consumption per unit area is reduced as compared with other resonant circuits having a larger duty ratio of the IDT electrode, the IMD is reduced. Further, since the duty ratio of the IDT electrodes of the series arm resonant circuit 111b and the parallel arm resonant circuit 121b which are closest to the common terminal Port1 and therefore, in which the power of the signal is most likely to be concentrated is reduced, the effect of reducing the IMD can be increased or maximized with respect to the demerit that the resonant circuit becomes larger in size.

In addition, in the above description, as for the filter 22, a case (filter 22a) in which at least one resonant circuit among the resonant circuits closest to the common terminal Port1 is defined by the group of divided resonators and a case (filter 22b) in which the duty ratio of the IDT electrode is made smaller than the duty ratio of the IDT electrode of the other resonant circuits are described by way of example.

Similar configurations are not limited to the filter 22, but may be applied to the filter 12, or both of the filters 22 and 12.

Next, the effect of reducing the IMD in a case where the filters 22a and 22b are used instead of the filter 22 in the quadplexer 1 will be described based on simulation results.

In the simulation, the IMD in the quadplexer 1 (FIG. 5A) including the filter 22 (FIG. 3) and the IMD in quadplexers (not illustrated) replacing the filter 22 of the quadplexer 1 with the filter 22a (FIG. 6) and the filter 22b (FIG. 7) were compared. In the following, the quadplexers including the filters 22, 22a, and 22b will be referred to as Comparative Example, Example 1, and Example 2, respectively.

Table 1 shows the electrode parameters set for the acoustic wave resonators included in the series arm resonant circuits 111, 111a, and 111b and the acoustic wave resonators included in the parallel arm resonant circuits 121, 121a and 121b in Comparative Example, Example 1, and Example 2. As for the series arm resonant circuit 111a and the parallel arm resonant circuit 121a defined by the group of divided resonators, the number of the divided resonators included in the group of divided resonators is indicated as a division number and the electrode parameters set in the individual division resonators are also shown. In Example 1 and Example 2, the electrode parameters denoted by asterisks are changed from Comparative example.

IDT electrodes of the series arm resonant circuit 111b and the parallel arm resonant circuit 121b is smaller than the duty ratio of the IDT electrodes of the other resonators.

The strength of the IMD in the reception band (about 2110 MHz to about 2170 MHz) of the Band1 at the individual terminal Port21 was calculated for Comparative Example, Example 1, and Example 2. In the calculation of the strength of the IMD, the application to the quadplexer 1a in the configuration of FIG. 5B is assumed, and signal strengths of the transmission signals of the Band1 and the Band3 at the output ends of the filter 22 and the filter 12 are set to about 25 dBm and about 10 dBm, respectively.

Figure 8:
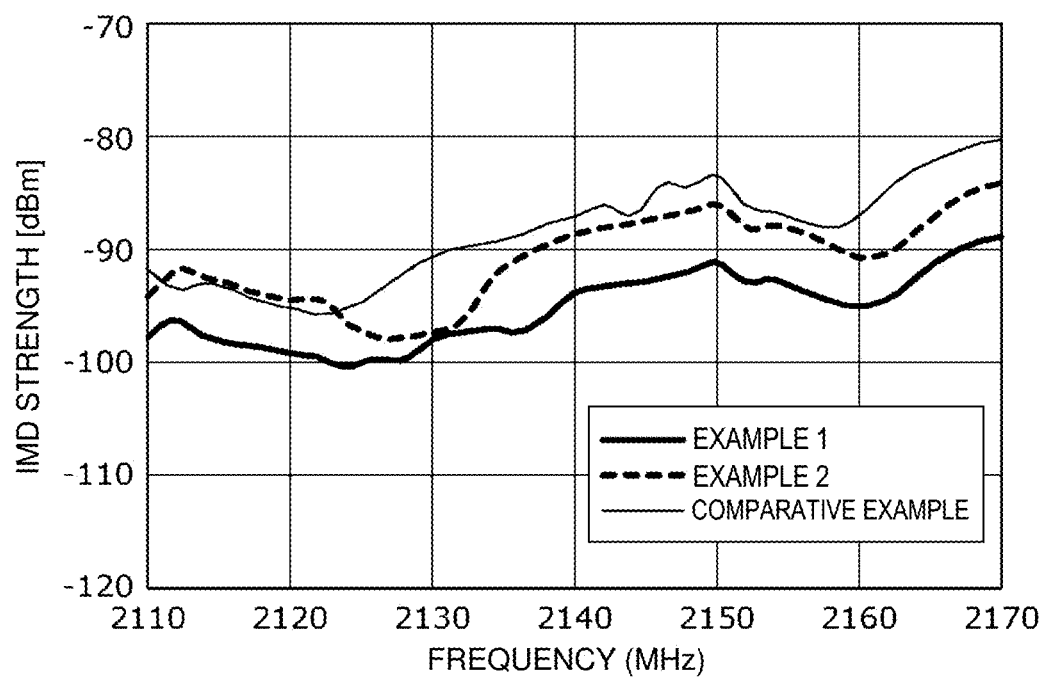
FIG. 8 is a graph showing a calculation example of strength of IMD according to a preferred embodiment of the present invention.

FIG. 8 is a graph illustrating an example of the calculation of the strength of the IMD. As illustrated in FIG. 8, the strength of the IMD in Example 1 is reduced (improved) in the entire reception band of the Band1, and the strength of the IMD in Example 2 is reduced (improved) in most portions of the reception band of the Band1 compared with the strength of the IMD in Comparative Example.

From this result, it has been confirmed to be effective for reduction in IMD that the resonance circuit which is closest to the common terminal and in which the power of the signal tends to concentrate and therefore, the IMD is likely to occur is defined by the group of divided resonators, or that the duty ratio of the IDT electrode of the resonant circuit is made to be smaller than the duty ratio of the IDT electrode of the other resonant circuits.

TABLE 1

| | ELECTRODE PARAMETER | WAVELENGTH $\lambda$ [μm] | NUMBER OF PAIRS N | INTERSECTING WIDTH L [$\lambda$] | DUTY RATIO W/(S + W) | DIVISION NUMBER |
|---|---|---|---|---|---|---|
| COMPARATIVE EXAMPLE | SERIES ARM RESONANT CIRCUIT 111 | 1.934 | 120 | 10 | 0.5 | 1 |
| | PARALLEL ARM RESONANT CIRCUIT 121 | 2.011 | 100 | 8 | 0.5 | 1 |
| EXAMPLE 1 | SERIES ARM RESONANT CIRCUIT 111a | 1.934 | 240* | 20* | 0.5 | 4* |
| | PARALLEL ARM RESONANT CIRCUIT 121a | 2.011 | 150* | 12* | 0.5 | 3* |
| EXAMPLE 2 | SERIES ARM RESONANT CIRCUIT 111b | 1.946* | 120 | 10 | 0.35* | 1 |
| | PARALLEL ARM RESONANT CIRCUIT 121b | 2.023* | 100 | 8 | 0.35* | 1 |

The electrode parameters of the acoustic wave resonators included in the series arm resonant circuits 112 to 114 and the parallel arm resonant circuits 122 to 124 not shown in Table 1 were the same or substantially the same as those in Comparative Example, Example 1 and Example 2. In particular, the duty ratio and the division number of the acoustic wave resonators included in the series arm resonant circuits 112 to 114 and the parallel arm resonant circuits 122 to 124 were set to 0.5 and 1 in all of Comparative Example, Example 1, and Example 2, respectively. Here, an acoustic wave resonator having a division number of 1 means a single acoustic wave resonator which is not divided.

As described above, in Example 1, among the resonant circuits defining the filter 22a, the series arm resonant circuit 111a and the parallel arm resonant circuit 121a are defined by a group of divided resonators. In Example 2, among the resonant circuits defining the filter 22b, the duty ratio of the Summary A multiplexer according to a preferred embodiment of the present invention includes a first transmission filter provided in a first path connecting a common terminal and a first terminal, a second transmission filter provided in a second path connecting the common terminal and a second terminal, and a reception filter provided in a third path connecting the common terminal and a third terminal, in which a frequency of intermodulation distortion generated from a first transmission signal of a frequency included in a pass band of the first transmission filter and a second transmission signal of a frequency included in a pass band of the second transmission filter is included in a pass band of the reception filter, the first transmission filter includes one or more series arm resonant circuits provided in the first path and one or more parallel arm resonant circuits provided in a path connecting a corresponding node on the first path and the ground, and in the one or more series arm resonant circuits and the one or more parallel arm resonant circuits of the first transmission filter, at least one resonant circuit among resonant circuits closest to the common terminal is defined by a group of divided resonators defined by a plurality of divided resonators connected in series to each other.

According to this configuration, at least one resonant circuit among the resonant circuits closest to the common terminal in the first transmission filter, that is, the resonant circuit in which the power of the signal tends to concentrate and thus likely to generate the IMD is defined by the group of divided resonators. As a result, the area occupied by the resonant circuit in the piezoelectric substrate becomes larger than the area in a case where the resonant circuit is defined by a single acoustic wave resonator. As a result, the power consumption per unit area is reduced, so that the IMD generated in the resonant circuit is reduced. Since the resonant circuit in which the power of the signal is most likely to concentrate is defined by the group of divided resonators, the effect of reducing the IMD can be maximized with respect to the demerit that the resonant circuit becomes larger in size.

Further, a frequency of IMD may be a frequency obtained by subtracting a frequency of the second transmission signal from two times a frequency of the first transmission signal.

As an example, when the first transmission signal and the second transmission signal are respective transmission signals of the Band1 and the Band3 in LTE (registered trademark), such a frequency of the IMD overlaps with the frequency of the reception band of the Band1. Therefore, the IMD having such a frequency is reduced, thereby suppressing the degradation in the reception sensitivity of the Band1.

Further, the second transmission filter may include one or more series arm resonant circuits provided in the second path, and one or more parallel arm resonant circuits provided in a path connecting a corresponding node on the second path and the ground, and in the one or more series arm resonant circuits and the one or more parallel arm resonant circuits of the second transmission filter, at least one resonant circuit among the resonant circuits closest to the common terminal may be defined by a group of divided resonators defined by a plurality of divided resonators connected in series to each other.

According to this configuration, the same or substantially the same advantageous effect as the reduction effect of the IMD described for the first transmission filter can also be obtained in the second transmission filter.

Further, a multiplexer according to a preferred embodiment of the present invention includes a first transmission filter provided in a first path connecting a common terminal and a first terminal, a second transmission filter provided in a second path connecting the common terminal and a second terminal, and a reception filter provided in a third path connecting the common terminal and a third terminal, in which a frequency of intermodulation distortion generated from a first transmission signal of a frequency included in a pass band of the first transmission filter and a second transmission signal of a frequency included in a pass band of the second transmission filter is included in a pass band of the reception filter, the first transmission filter includes one or more series arm resonant circuits arranged on the first path and one or more parallel arm resonant circuits provided in a path connecting a corresponding node on the first path and the ground, the one or more series arm resonant circuits and the one or more parallel arm resonant circuits of the first transmission filter are each defined by an acoustic wave resonator having an IDT electrode, and a duty ratio of an IDT electrode of at least one resonant circuit among resonant circuits closest to the common terminal in the one or more series arm resonant circuits and the one or more parallel arm resonant circuits of the first transmission filter is smaller than a duty ratio of an IDT electrode of any other resonant circuits of the first transmission filter.

According to this configuration, at least one resonant circuit among the resonant circuits closest to the common terminal in the first transmission filter, that is, the duty ratio of the IDT electrode of the resonant circuit in which the IMD is likely to be generated because the power of the signal tends to concentrate, is configured to be smaller than the duty ratio of the IDT electrodes of the other resonant circuits. As such, compared to a case where the resonant circuit is configured with a duty ratio of the IDT electrode which is the same or substantially the same as that of the other resonant circuit, the repeating period of the electrode fingers of the resonant circuit can be increased, so that the area occupied by the resonant circuit in the piezoelectric substrate is increased. As a result, the power consumption per unit area is reduced, so that the IMD generated in the resonant circuit is reduced. Since the duty ratio of the IDT electrode of the resonant circuit in which the power of the signal is most likely to concentrate is reduced, the advantageous effect of reducing the IMD can be increased or maximized with respect to the demerit that the resonance circuit becomes larger in size.

Further, a frequency of IMD may be a frequency obtained by subtracting a frequency of the second transmission signal from two times a frequency of the first transmission signal.

As an example, when the first transmission signal and the second transmission signal are respective transmission signals of the Band1 and the Band3 in the LTE (registered trademark) standard, such a frequency of the IMD overlaps with the frequency of the reception band of the Band1. Therefore, the IMD having such a frequency is reduced, thereby suppressing the degradation in the reception sensitivity of the Band1.

Further, the second transmission filter may include one or more series arm resonant circuits provided in the second path and one or more parallel arm resonant circuits provided in a path connecting a corresponding node on the second path and the ground, the one or more series arm resonant circuits and the one or more parallel arm resonant circuits of the second transmission filter each may be defined by an acoustic wave resonator including an IDT electrode, and a duty ratio of the IDT electrode of at least one resonant circuit among resonant circuits closest to the common terminal in the one or more series arm resonant circuits and the one or more parallel arm resonant circuits of the second transmission filter may be smaller than a duty ratio of the IDT electrode of any other resonant circuits of the second transmission filter.

According to this configuration, the same advantageous effect as the reduction effect of the IMD described for the first transmission filter can also be obtained in the second transmission filter.

In addition, in the first transmission filter and the second transmission filter, a pass band of one filter may preferably be, for example, equal to or more than about 1920 MHz and equal to or less than about 1980 MHz, and a pass band of another filter may preferably be, for example, equal to or more than about 1710 MHz and equal to or less than about 1785 MHz, and a pass band of the reception filter may preferably be, for example, equal to or more than about 2110 MHz and equal to or less than about 2200 MHz.

According to this configuration, the pass band of the first filter and the pass band of the second filter are one and the other of the transmission band Band1Tx of the Band1 and the transmission band Band3Tx of the Band3. Also, the pass band of the reception filter is the reception band Band1Rx of the Band1. That is, the first transmission filter and the second transmission filter are used as one and the other of the transmission filter of the Band1 and the transmission filter of the Band3, and the reception filter is used as the reception filter of the Band1.

Here, the frequency obtained by subtracting the frequency of the transmission signal of the Band3 from two times the frequency of the transmission signal of the Band1 is overlapped with the frequency of the reception signal of the Band1. For this reason, when the transmission signal of the Band1 and the transmission signal of the Band3 are transmitted simultaneously, the transmission signal of the Band1 and the transmission signal of the Band3 become interference waves with each other, so that the IMD at high level is generated in the reception band Band1Rx of the Band1.

Therefore, a filter with countermeasures to reduce the IMD is used as the first transmission filter or both of the first transmission filter and the second transmission filter. Thus, the IMD generated in the reception band Band1Rx of the Band1 can be reduced, and for example, the deterioration in the reception sensitivity of the Band1 can be suppressed.

Although the multiplexers according to preferred embodiments of the present invention has been described above, the present invention is not limited to the individual preferred embodiments. Preferred embodiments obtained by adding various modifications which are conceived by those skilled in the art to the present preferred embodiment without departing from the spirit of the present invention, or a mode which is constructed by combining constituent elements in different preferred embodiments may also be included within the scope of one or more aspects of the present invention.

According to this configuration, in the resonant circuits defining the first transmission filter, at least one resonant circuit among the resonant circuits closest to the common terminal, that is, the resonant circuit in which the power of the signal tends to concentrate most and therefore the IMD is most likely to be generated is defined by the group of divided resonators, or is defined by the resonant circuit having the duty ratio of the IDT electrode smaller than the duty ratio of the IDT electrode of the other resonant circuits.

Whereby, the area occupied by the resonant circuit in the piezoelectric substrate is increased, and power consumption per unit area is reduced, so that the IMD generated in the resonant circuit is reduced. Since the resonant circuit in which the power of the signal tends most to concentrate is divided, the effect of reducing the IMD can be maximized with respect to the demerit that the resonance circuit becomes larger in size.

INDUSTRIAL APPLICABILITY

Preferred embodiments of the present invention are widely applicable to communication devices, such as mobile phones, for example, as multiplexers that are excellent in low noise.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a first transmission filter provided in a first path electrically connecting a common terminal and a first terminal;
   a second transmission filter provided in a second path electrically connecting the common terminal and a second terminal; and
   a reception filter provided in a third path electrically connecting the common terminal and a third terminal; wherein
      a frequency of intermodulation distortion generated from a first transmission signal of a frequency included in a pass band of the first transmission filter and a second transmission signal of a frequency included in a pass band of the second transmission filter is included in a pass band of the reception filter;
      the first transmission filter includes one or more series arm resonant circuits provided in the first path and one or more parallel arm resonant circuits provided in a path electrically connecting a corresponding node on the first path and the ground; and
      in the one or more series arm resonant circuits and the one or more parallel arm resonant circuits of the first transmission filter, at least one resonant circuit among resonant circuits closest to the common terminal is defined by a group of divided resonators including a plurality of divided resonators electrically connected in series to each other.

2. The multiplexer according to claim 1, wherein the frequency of the intermodulation distortion is a frequency obtained by subtracting a frequency of the second transmission signal from two times a frequency of the first transmission signal.

3. The multiplexer according to claim 1, wherein
   the second transmission filter includes one or more series arm resonant circuits provided in the second path, and one or more parallel arm resonant circuits provided in a path electrically connecting a corresponding node on the second path and the ground; and
   in the one or more series arm resonant circuits and the one or more parallel arm resonant circuits of the second transmission filter, at least one resonant circuit among the resonant circuits closest to the common terminal is defined by a group of divided resonators including a plurality of divided resonators electrically connected in series to each other.

4. A multiplexer comprising:
   a first transmission filter provided in a first path electrically connecting a common terminal and a first terminal;
   a second transmission filter provided in a second path electrically connecting the common terminal and a second terminal; and
   a reception filter provided in a third path electrically connecting the common terminal and a third terminal; wherein
      a frequency of intermodulation distortion generated from a first transmission signal of a frequency included in a pass band of the first transmission filter and a second transmission signal of a frequency included in a pass band of the second transmission filter is included in a pass band of the reception filter;
      the first transmission filter includes one or more series arm resonant circuits provided in the first path and one or more parallel arm resonant circuits provided in a path electrically connecting a corresponding node on the first path and the ground;

the one or more series arm resonant circuits and the one or more parallel arm resonant circuits of the first transmission filter are each defined by an acoustic wave resonator including an interdigital transducer (IDT) electrode; and a duty ratio of an IDT electrode of at least one resonant circuit among resonant circuits closest to the common terminal in the one or more series arm resonant circuits and the one or more parallel arm resonant circuits of the first transmission filter is smaller than a duty ratio of an IDT electrode of any other resonant circuit of the first transmission filter.

5. The multiplexer according to claim 4, wherein the frequency of the intermodulation distortion is a frequency obtained by subtracting a frequency of the second transmission signal from two times a frequency of the first transmission signal.

6. The multiplexer according to claim 4, wherein the second transmission filter includes one or more series arm resonant circuits provided in the second path and one or more parallel arm resonant circuits provided in a path electrically connecting a corresponding node on the second path and the ground;

the one or more series arm resonant circuits and the one or more parallel arm resonant circuits of the second transmission filter are each defined by an acoustic wave resonator including an IDT electrode; and a duty ratio of an IDT electrode of at least one resonant circuit among resonant circuits closest to the common terminal in the one or more series arm resonant circuits and the one or more parallel arm resonant circuits of the second transmission filter is smaller than a duty ratio of an IDT electrode of any other resonant circuit of the second transmission filter.

7. The multiplexer according to claim 1, wherein in the first transmission filter and the second transmission filter, a pass band of one filter is equal to or more than about 1920 MHz and equal to or less than about 1980 MHz, and a pass band of another filter is equal to or more than about 1710 MHz and equal to or less than about 1785 MHz; and a pass band of the reception filter is equal to or more than about 2110 MHz and equal to or less than about 2200 MHz.

8. The multiplexer according to claim 1, wherein the first transmission filter and the second transmission filter are defined by band-pass filters having a ladder structure.

9. The multiplexer according to claim 1, wherein each of the divided resonators is defined by an acoustic wave resonator having interdigital transducer (IDT) electrodes.

10. The multiplexer according to claim 1, wherein in the one or more series arm resonant circuits and the one or more parallel arm resonant circuits of the first transmission filter, a total area of the plurality of divided resonators is greater than total areas of remaining ones of the resonant circuits.

11. The multiplexer according to claim 4, wherein the duty ratio of the IDT electrode of the at least one resonant circuit among resonant circuits closest to the common terminal in the one or more series arm resonant circuits and the one or more parallel arm resonant circuits of the first transmission filter is set to 0.5 and the duty ratio of the IDT electrode of the any other resonant circuit of the first transmission filter is set to 1.0.

* * * * *